US006169502B1

(12) United States Patent
Johnson et al.

(10) Patent No.: US 6,169,502 B1
(45) Date of Patent: Jan. 2, 2001

(54) PIPELINED ANALOG-TO-DIGITAL CONVERTER (ADC) SYSTEMS, METHODS, AND COMPUTER PROGRAM PRODUCTS

(75) Inventors: Sandra Marie Johnson, Buda; David R. Welland, Austin, both of TX (US)

(73) Assignee: Cirrus Logic, Inc., Fremont, CA (US)

( * ) Notice: Under 35 U.S.C. 154(b), the term of this patent shall be extended for 0 days.

(21) Appl. No.: 09/075,506

(22) Filed: May 8, 1998

(51) Int. Cl.[7] ................................................. H03M 1/10
(52) U.S. Cl. ................................. 341/120; 341/155
(58) Field of Search .............................. 341/120, 155, 341/118, 161, 156, 172, 162

(56) References Cited

U.S. PATENT DOCUMENTS

| | | | |
|---|---|---|---|
| 4,745,394 | * 5/1988 | Cornett | 340/120 |
| 4,849,711 | * 7/1989 | Leis et al. | 330/279 |
| 4,894,656 | * 1/1990 | Hwang et al. | 341/120 |
| 4,970,514 | * 11/1990 | Draxelmayr | 341/120 |
| 4,999,625 | * 3/1991 | Thompson | 341/118 |
| 5,027,116 | * 6/1991 | Armstrong et al. | 341/120 |
| 5,047,772 | * 9/1991 | Ribner | 341/156 |
| 5,248,970 | * 9/1993 | Sooch et al. | 341/120 |
| 5,341,135 | * 8/1994 | Pearce | 341/120 |
| 5,499,027 | * 3/1996 | Karanicolas et al. | 341/120 |
| 5,534,864 | * 7/1996 | Ono et al. | 341/156 |
| 5,541,602 | * 7/1996 | Opris et al. | 341/161 |
| 5,574,457 | * 11/1996 | Garrity et al. | 341/172 |
| 5,635,937 | * 6/1997 | Lim et al. | 341/161 |
| 5,668,549 | * 9/1997 | Opris et al. | 341/118 |
| 5,784,016 | * 7/1998 | Nagaraj | 341/120 |
| 5,808,725 | * 9/1998 | Moberg et al. | 355/67 |
| 5,929,796 | * 7/1999 | Opris et al. | 341/120 |

* cited by examiner

Primary Examiner—Howard L. Williams
Assistant Examiner—Jean B. Jeanglaude
(74) Attorney, Agent, or Firm—Robert P. Sabath; Jonathan Harris; Peter T. Tutkowski

(57) ABSTRACT

A pipelined analog-to-digital converter (ADC) is calibrated to enable production of an n-bit digital output representing an n-2 bit binary word, where "n" is a selected large positive integer, for example without limitation on the order of ten (10). In an analog-to-digital converter (ADC) having a plurality stages, each stage includes a stage input connection, a stage output connection, and a capacitor circuit including first and second predetermined capacitors ($C_1$ and $C_2$) and a variable capacitance calibration capacitor (Ccal). The first and second capacitors and the variable capacitance calibration capacitor are connected to each other at a capacitor common node. An amplifier input connection is connected to a capacitor common node. A comparator input connection (CIC) is connected to a stage input connection. A track and hold circuit (THC) is coupled to an amplifier output connection, and a source follower circuit (SF) is connected to a stage output connection.

14 Claims, 6 Drawing Sheets

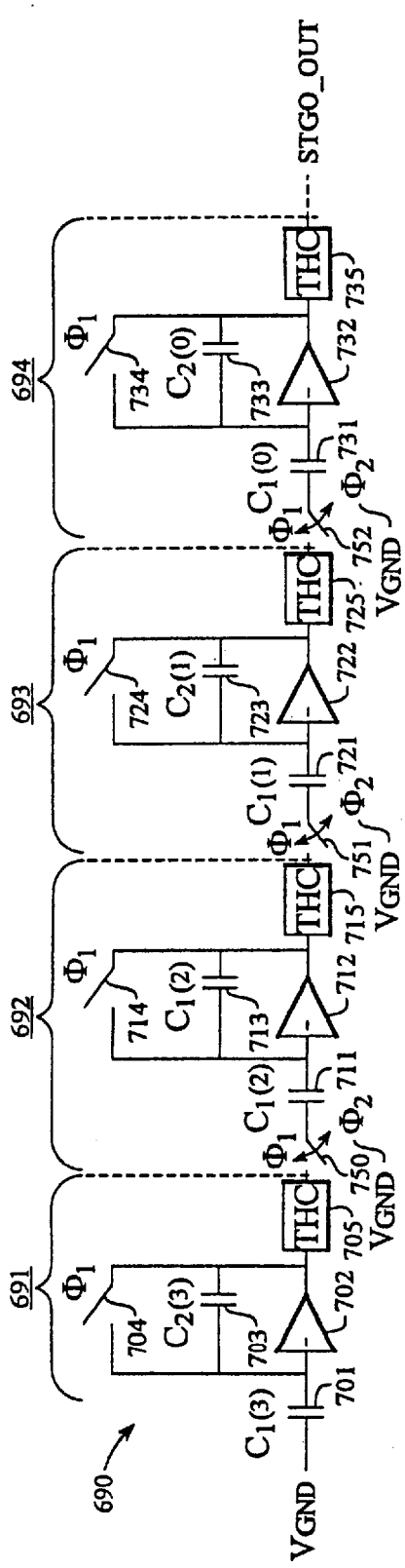
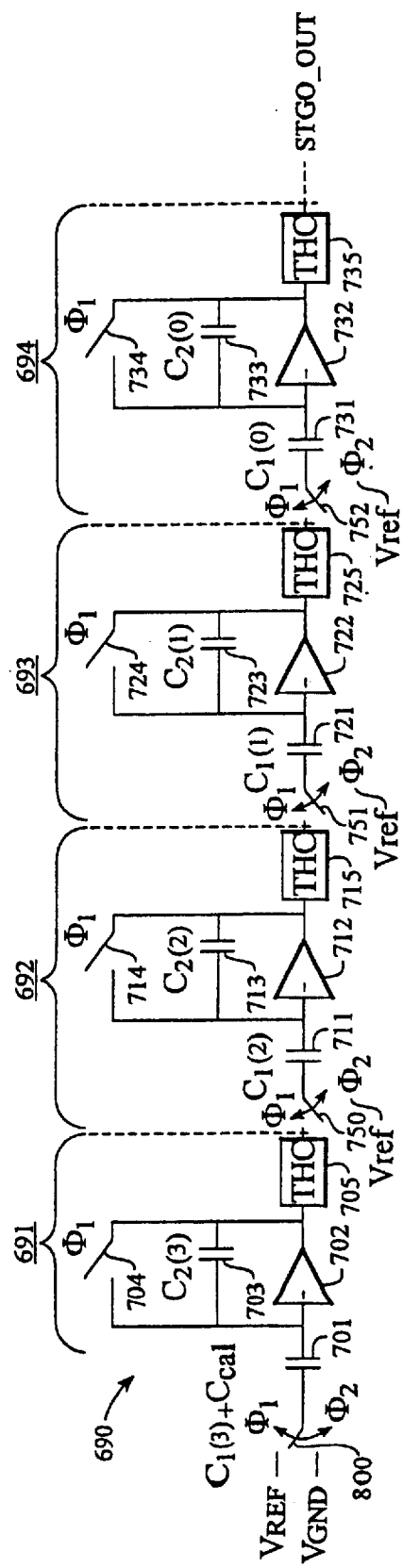
Fig. 7
Fig. 8

PIPELINED ANALOG-TO-DIGITAL CONVERTER (ADC) SYSTEMS, METHODS, AND COMPUTER PROGRAM PRODUCTS

This application is related to patent application Ser. Nos. 09/075,382, 09/025,491, 09/075,449, 09/075,446, and 09/075,348, respectively entitled "Image Processor Circuits, Systems, and Methods" having inventors Sandra Marie Johnson, Shih-Chung Chao, Nadi Rafik Itani, Caiyi Wang, Brannon Craig Harris, Ash Prabala, Douglas R. Holberg, Alan Hansford, Syed Khalid Azim, and David R. Welland; "Digital Camera Signal Processor and Method" having inventors Syed Khalid Azim, Shih-Chung Chao, Brannon Craig Harris, and Ash Prabala; "High Voltage Input Pad System and Method" having inventors Douglas R. Holberg, Nadi Rafik Itani, and David R. Welland; "Histogram-Based Automatic Gain Control Method and System for Video Applications" having inventors Nadi Rafik Itani, Caiyi Wang, and David R. Welland; and "Selectable Threshold Multimode Gain Control Apparatus and Method for Setting Mutually Continuous Analog, Digital, and Shutter Gain Levels" having inventors Nadi Rafik Itani, Caiyi Wang, and David R. Welland, each of these applications filed on even date herewith, and each incorporated herein by reference in its entirety.

COPYRIGHT AUTHORIZATION

A portion of the disclosure of this patent document contains material which is subject to copyright protection. The copyright owner has no objection to the facsimile reproduction by anyone of the patent disclosure as it appears in the U.S. Patent and Trademark Office files or records, but otherwise reserves all copyrights whatsoever.

BACKGROUND OF THE INVENTION

1. Field of the Invention

The field of this invention relates to systems, methods, and computer program products relating to analog-to-digital converters (ADCs) and more particularly to calibration systems, methods, and computer program products relating to pipelined ADCs.

2. Description of Related Art

The technical problems of calibrating pipelined analog-to-digital converters (ADCs) have been inadequately addressed in the related art. In particular, the related art addresses the use of a capacitor array for calibration of pipelined ADCs with calibration alterations changing the gain (R) of particular ADC stages to satisfy a predetermined weighting relationship. This is accomplished with successive capacitors that are increasingly lower or higher in capacitance level depending upon the weighting scheme which has been selected. For highly accurate ADC systems, the ratio of largest to smallest capacitor unfortunately results in a requirement to use capacitors of prohibitive capacitance levels. Simply stated, a highly accurate ADC system according to the related art requires very small and very large capacitors. Such a range of capacitance values is difficult and costly to implement with semiconductor materials.

SUMMARY OF THE INVENTION

According to one embodiment of the present invention, a pipelined analog-to-digital converter (ADC) is calibrated to enable production of an n-bit digital output representing an n-2 bit binary word, where "n" is a selected large positive integer, for example without limitation on the order of ten (10). In a multistage analog-to-digital converter (ADC) according to the present invention, each stage includes capacitor circuitry including first and second predetermined capacitors ($C_1$ and $C_2$) and a variable capacitance calibration capacitor ($C_{cal}$) connected to an amplifier at a common node. A multistage ADC stage according to the present invention further includes a comparator, a track and hold circuit, and a source follower circuit. According to one embodiment of the present invention, a multistage ADC system includes at least four stages, each in turn including a capacitor system including first and second predetermined capacitors and a calibration capacitor, an amplifier, a comparator, a tracker, and a source follower. The capacitor system according to the present invention is connected at a common node to the amplifier; the comparator is connected to the first predetermined capacitor; the tracker and source follower are connected to the output of the amplifier; and the source follower is connected to the comparator. According to a method of the present invention, a first predetermined capacitor and a comparator are coupled to an input connection for each of at least four stages. Further, a second predetermined capacitor is coupled to ground in the case of each stage. Then, the first predetermined capacitor is disconnected from the input connection, for each stage, and the second predetermined capacitor is connected to the output of the amplifier in each stage. Further, the output of the amplifier is tracked and the output is provided to the comparator of the subsequent stage to enable a determination of whether this voltage is greater than or less than the reference voltage.

BRIEF DESCRIPTION OF THE DRAWINGS

FIG. 7 is a circuit diagram of the final stages of a pipelined ADC system according to the present invention, configured for offset cancellation.

FIG. 8 is a circuit diagram of the final four steps of a pipelined ADC system according to the present invention.

DETAILED DESCRIPTION OF A PREFERRED MODE

Figure 1:
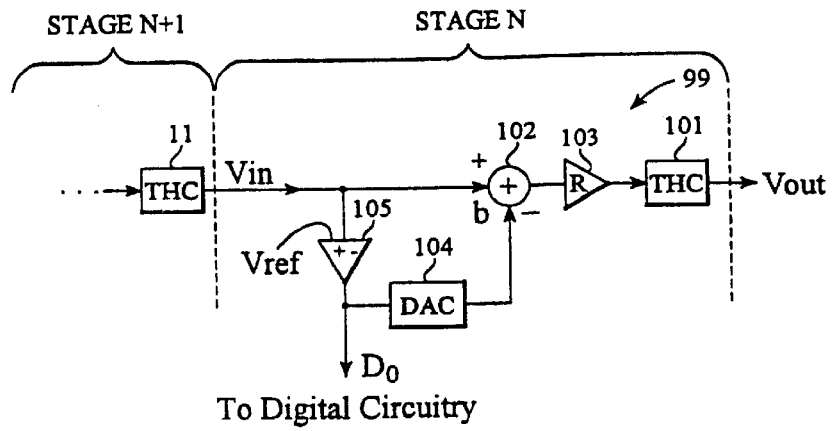
FIG. 1 is a circuit diagram of one stage of a general pipelined analog-to-digital converter system (PADCS) according to the present invention.

Referring now to FIG. 1, there is shown a circuit diagram of an nth stage and a portion of the (n+1)th stage of a pipelined analog-to-digital converter system (PADCS) 99 according to the present invention. In particular, the (n+1)th stage of PADCS 99 includes a track and hold circuit (THC)

11 according to the present invention, whose output is the analog input voltage ($V_{IN}$) of the nth stage. The nth stage of PADCS 99 includes a summation node 102, an amplifier 103, a digital-to-analog converter (DAC) 104, a comparator 105, and a THC 101. The input analog voltage $V_{IN}$ is connected to comparator 105 and to summation node 102. Summation node 102 is connected to $V_{IN}$ and DAC 104 at its input and to amplifier 103 at its output. The output of comparator 105 is connected to the input of DAC 104. The output of amplifier 103 is connected to the input of THC 101. In general, a pipeline stage may be described as shown in FIG. 1. An input voltage enters, which is then provided to comparator 105. This input voltage level is compared to a selected reference voltage, and if the input voltage is larger than the reference voltage, the output of the comparator 105 is a digital bit of one; if the input voltage is smaller than the reference voltage, an output is generated which is a digital bit of zero. The particular digital bit is sent to digital circuitry (not shown), which generates an ADC binary output, as well as through digital-to-analog converter 104, the output of which is the digital bit multiplied by a selected reference voltage. This voltage is subtracted from the input voltage, and the resulting voltage is multiplied by a gain of R. This output is then connected to THC 101. The value of R according to one embodiment of the present invention is greater than one and no more than two. According to one embodiment of the present invention, the value of R is greater than 1.6. The transfer function of a pipelined ADC system according to one embodiment of the present invention is:

$$V_{out}=R_0*(R_1*(\ldots *(R_{n-1}*(R_n*(V_{in}-b_n)-\ldots)-b_1)-b_0), \quad (1)$$

where $V_{out}$ is the output voltage from PADCS 99;

$R_n$ is the gain of the nth stage;

$V_{in}$ is the input voltage to PADCS 99;

$b_n$ is the nth selected reference voltages provided to summation node 102 from DAC 104; and $$V_{in} = b_n + \frac{b_{(n-1)}}{R_n} + \ldots + \frac{b_1}{(R_n R_{(n-1)} \ldots R_2)} + \frac{b_0}{(R_n R_{(n-1)} \ldots R_1)} + \frac{V_{out}}{(R_n R_{(n-1)} \ldots R_0)}, \quad (2)$$

where $b_n = D_n V_{ref(n)}$; and $D_n$ is the digital output of comparator 105.

Figure 2:
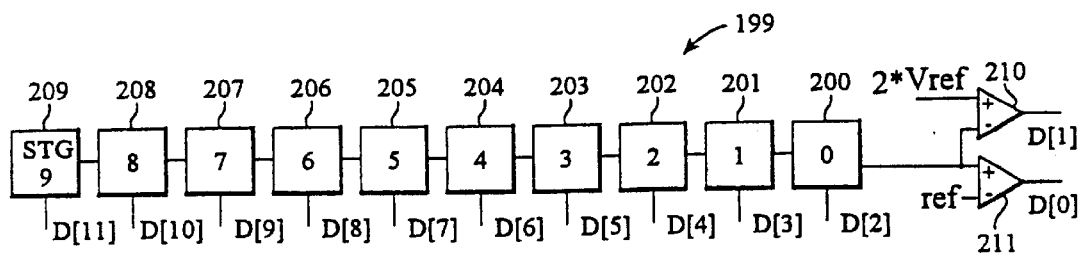
FIG. 2 is a circuit diagram of a ten stage PADCS according to the present invention, including first and second comparators used to generate twelve bits that map to a 10-bit binary word.

Referring now to FIG. 2, there is shown a circuit diagram of a ten stage ADC 199 according to the present invention including first and second comparators 210, 211 used to generate twelve bits that map to a 10-bit binary word. In particular, ADC 199 includes first and second comparators 210, 211 and ten ADC stages (0–9), respectively producing outputs D[0]–D[11] to represent a 10-bit binary word. The output of the nth ADC stage is the input of the (n−1)th ADC stage, and the output of the zeroth ADC stage is an input of each of comparators 210 and 211. Comparator 210 produces the first output D[1] bit and has a reference input of twice a predetermined reference voltage Vref. Comparator 211 produces the zeroth output D[0] and has an input reference value of the predetermined reference voltage Vref. An nth ADC state has a gain value R which is determined by calibration as follows. Gain calibration is an analog process, and the weight of each ADC stage is digitally hard-coded. The weight is a value which is added to the ADC output word when a binary one is the output from a particular stage.

Thus, with four ADC stages having binary weighting with the output of the most-significant ADC stage being one in magnitude, the weight on the final output word is 2**4, or 16. Each ADC stage is calibrated by setting the weight of a particular stage equal to the sum of the weights of the three subsequent stages.

$$W_n=W_{n-1}+W_{n-2}+W_{n-3}, \quad (3)$$

where $W_n$ is the weight of a selected nth ADC stage;

$W_{n-1}$ is the weight of the ADC stage immediately after the nth stage which has a weight $W_n$;

$W_{n-2}$ is the weight of the ADC stage immediately after the (n−1)th stage which has a weight $W_{n-1}$; and $W_{n-3}$ is the weight of the ADC stage immediately after the (n−2)th stage which has a weight $W_{n-2}$.

The gain $R_n$ of a particular stage n can thus be described according the relationship:

$$R_n*R_{n-1}*R_{n-2}*R_{n-3}=R_{n-1}*R_{n-2}*R_{n-3}+R_{n-2}*R_{n-3}+R_{n-3} \quad (4)$$

which produces a transfer function for the four stage ADC of:

$$V_{out}=R_n*R_{n-1}*R_{n-2}*R_{n-3}*V_{in}(n)-$$
$$R_n*R_{n-1}*R_{n-2}*R_{n-3}*D_n*V_{ref}(n)-$$
$$R_{n-1}*R_{n-2}*R_{n-3}*D_{n-1}*V_{ref}(n-1)-R_{n-}$$
$$2*R_{n-3}*D_{n-2}*V_{ref}(n-2)-R_{n-3}*D_{n-}$$
$$3*V_{ref}(n-2). \quad (5)$$

According to the present invention, the calibration method sets the output voltage of D[n:(n−3)]=1000 equal to the output voltage of D[n:(n−3)]=0111 to satisfy equation (4).

$$D[n:(n-3)]=1000:V_{out}=R_n*R_{n-1}*R_{n-2}*R_{n-3}*V_{in}(n)-R_n*R_{n-1}*R_{n-2}*R_{n-3}*V_{ref}(n). \quad (6)$$

$$D[n:(n-3)]=0111:V_{out}=R_n*R_{n-1}*R_{n-2}*R_{n-3}*V_{in}(n)-R_{n-1}*R_{n-2}*R_{n-3}*V_{ref}(n-1)-R_{n-2}*R_{n-3}*V_{ref}(n-2)-R_{n-3}*V_{ref}(n-2). \quad (7)$$

It follows that:

$$R_n*R_{n-1}*R_{n-2}*R_{n-3}*V_{ref}(n)=R_{n-1}*R_{n-2}*R_{n-3}*V_{ref}(n-1)+R_{n-2}*R_{n-3}*V_{ref}(n-2)+R_{n-3}*V_{ref}(n-2). \quad (8)$$

$$R_n=[V_{ref}(n-1)+V_{ref}(n-2)/R_{n-1}+V_{ref}(n-3)/(R_{n-1}*R_{n-2})]/V_{ref}(n). \quad (9)$$

The method according to the present invention thus accounts for the reference voltages of the various stages not being equal. The weighting of each stage is altered according to the present invention based on different reference voltages, resulting in matching of hard-coded digital settings. The presence of initial errors in three 3 lower stages which are not calibrated produces little effect on the gains of the more significant stages. Thus, a fixed setting used in the digital logic according to the present invention for each state even in the presence of certain error in the least-significant bits is accepted. Using this method according to the present invention to set the gains, the values of $R_9$–$R_0$ range from 1.839–1.860 according to one embodiment of the present invention.

Figure 3:
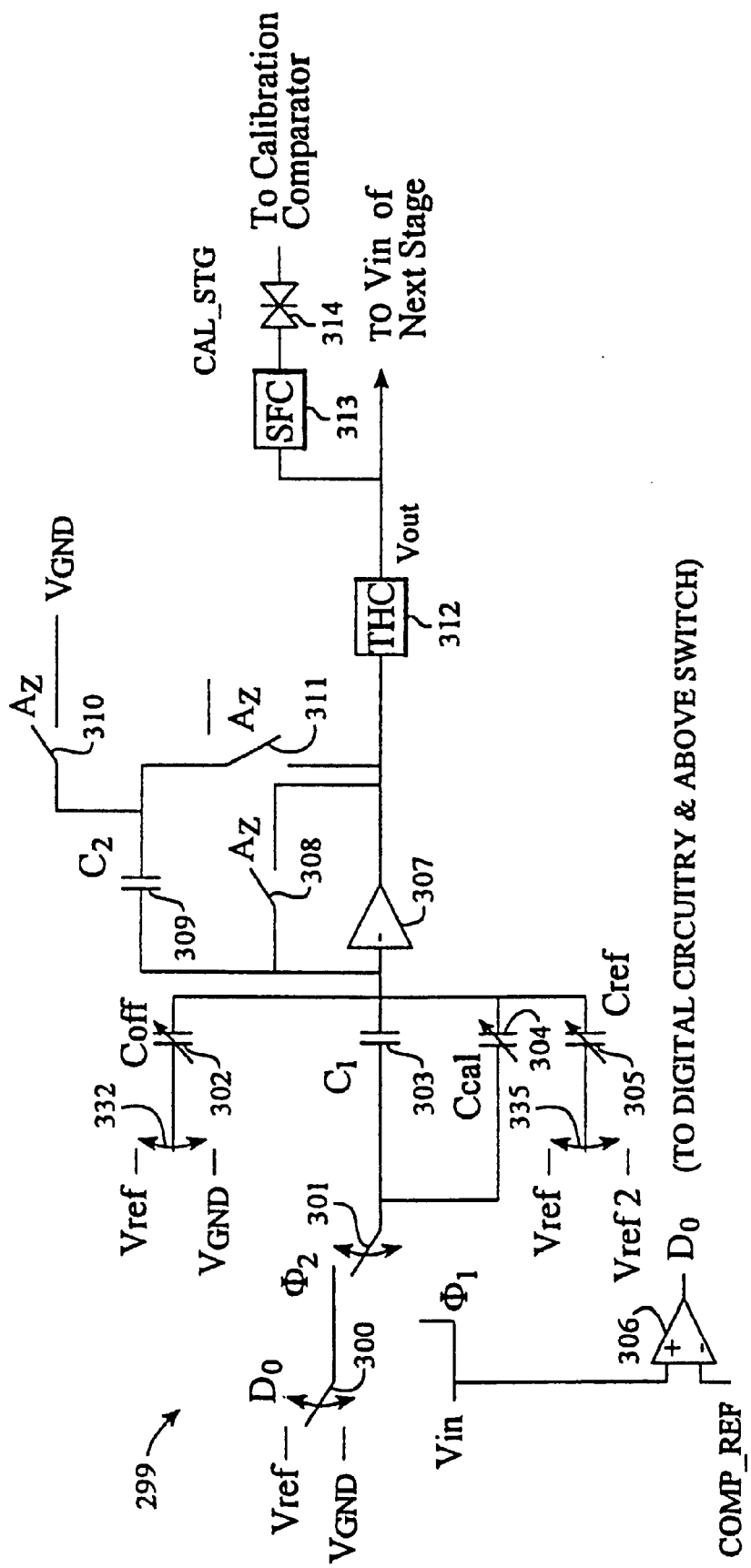
FIG. 3 is another circuit diagram of a single stage of a PADCS according to one embodiment of the present invention.

Referring now to FIG. 3, there is shown another circuit diagram of a single stage 299 of a pipelined ADC according to one embodiment of the present invention. In particular, single stage 299 includes first through fourth switches respectively 300, 301, 332, and 335; first through fourth capacitors respectively 302–305 (three of them—302, 304 and 305—being variable; and one capacitor 303 being fixed); a comparator 306 and an amplifier 307; an AZ bypass switch 308; a feedback capacitor 309; a first control switch 311 and a second AZ switch 310; a track and hold cell (THC) 312; a source follower (SF) circuit 313; and a transmission gate 314. The input voltage $V_{in}$ is connected via switch 301 to capacitors C1 and Ccal, respectively 303 and 304, during a first clock phase. The AZ switches 308 and 310 are closed during the first clock phase, causing the amplifier 307 to have unity gain and causing one side of capacitor 309 (C2) to be connected to a reference ground (Vgnd). The input voltage $V_{in}$ is connected to an input of the comparator 306 and that value is compared to the comparator reference. If the input voltage is greater than the reference voltage, the digital output, Do, will be a logical high value. Otherwise, the digital output will be a logical low value. One side of capacitors C1, Ccal, Cref and Coff, and C2 is connected to the input of the amplifier 307 which in turn is connected to the track-and-hold circuit (THC) 312, which is in a hold state during a first clock phase. The output of the THC 312 is the input to the source follower circuit (SFC) 363, and the input to the subsequent ADC stage. The output of the SFC 313 is connected to a calibration comparator (not shown), if a cal_stg signal is high and is tri-stated if the particular signal is low. In a second clock phase, either Vgnd or a reference voltage (Vref) is connected to the input, and the output of the amplifier 307 is in feedback. The THC 312 tracks the output of the amplifier 307 during the second clock phase. Accordingly, the gain from the input to the output is R=(C1+Ccal)/C2. This value is less than two, causing a redundancy in the system. This redundancy allows comparator 306 references to be biased so that when the output of the comparator is in error, it will more likely output a low value than a high value. The remaining ADC states thus can recover from this low value error due to the redundancy in the system according to the present invention.

Figures 4A, 4B:
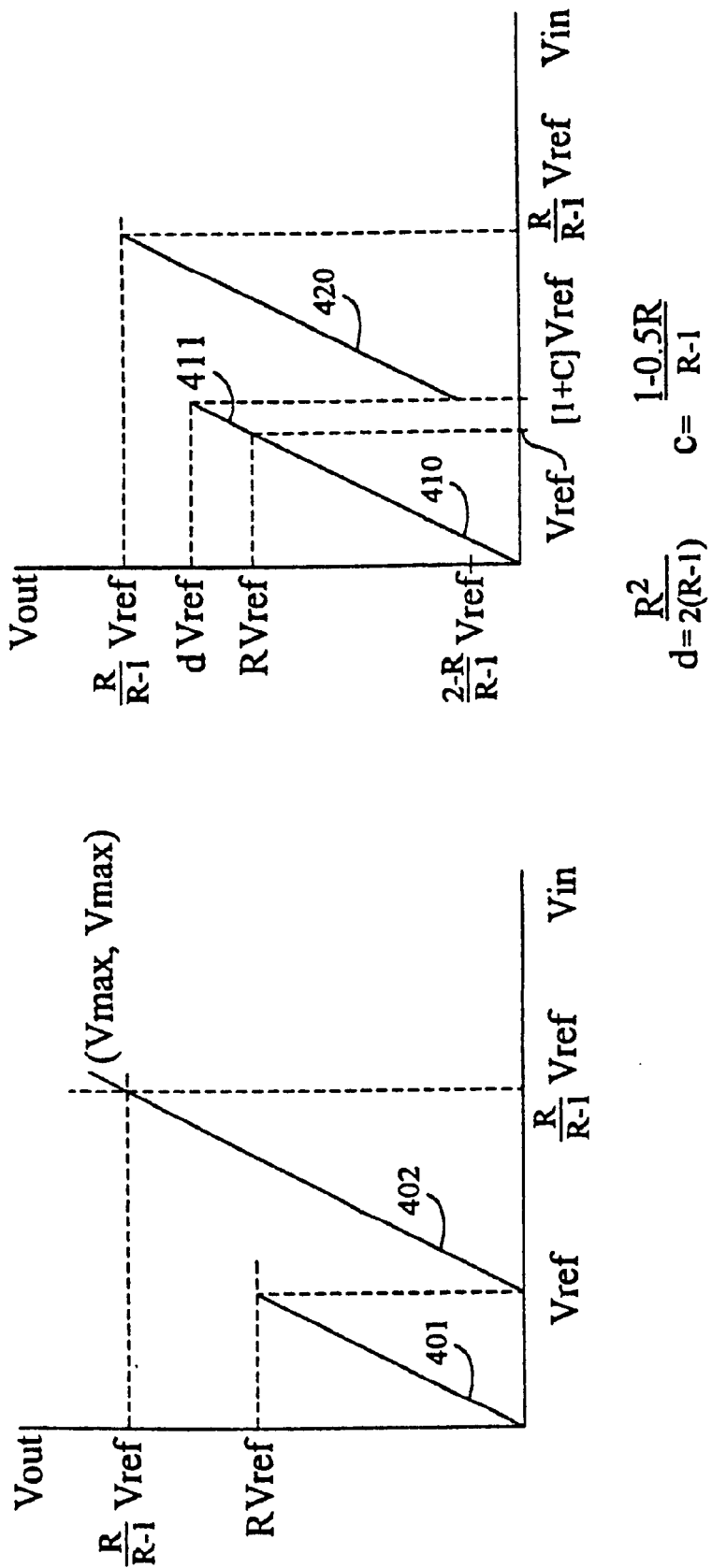
FIG. 4A is a graph of the transfer function of a comparator according to the present invention without reference biasing.
FIG. 4B is a graph of the transfer function of a comparator according to the present invention with reference biasing.

Referring now to FIG. 4A, there is shown a graph of the transfer function of a comparator according to the present invention which has no reference biasing. In particular, FIG. 4A shows a graph of Vout as a function of Vin, in which the relationship is linear along segment 401 between input voltage zero and Vref, and is linear between output voltage zero and R Vref. This linear relationship is maintained as well between input voltage Vref and (R/(R−1))Vref, and between output voltage zero and (R/(R−1)Vref, i.e., (Vmax, Vmax). The input voltage at each stage is in the range of 0 to Vmax volts according to the present invention. If Vout of a given stage is less than 0 or greater than Vmax, the remaining stages cannot convert that voltage.

Referring now to FIG. 4B, there is shown a graph of the transfer function of a comparator which includes reference biasing according to the present invention. In particular, FIG. 4B shows a graph of Vout as a function of Vin, in which the relationship is linear along segment 410 and the extension 411 thereof between input voltage zero and [1+C]Vref, and between output voltage zero and d*Vref. The relationship is linear as well between input voltage [1+C]Vref and (R/(R−1))Vref, and between output voltage [(2−R)/(R−1)] *Vref and [R/(R−1)]*Vref. By adjusting the comparator reference, the transfer function can be centered between Vmax and 0 such that there is a margin of +/−[(1−0.5R)/(R−1)] Vref, as shown in FIG. 4B. Accordingly, if the comparator or system has an offset, the system can recover as long as the offset is within the margin of error.

Figure 5A:
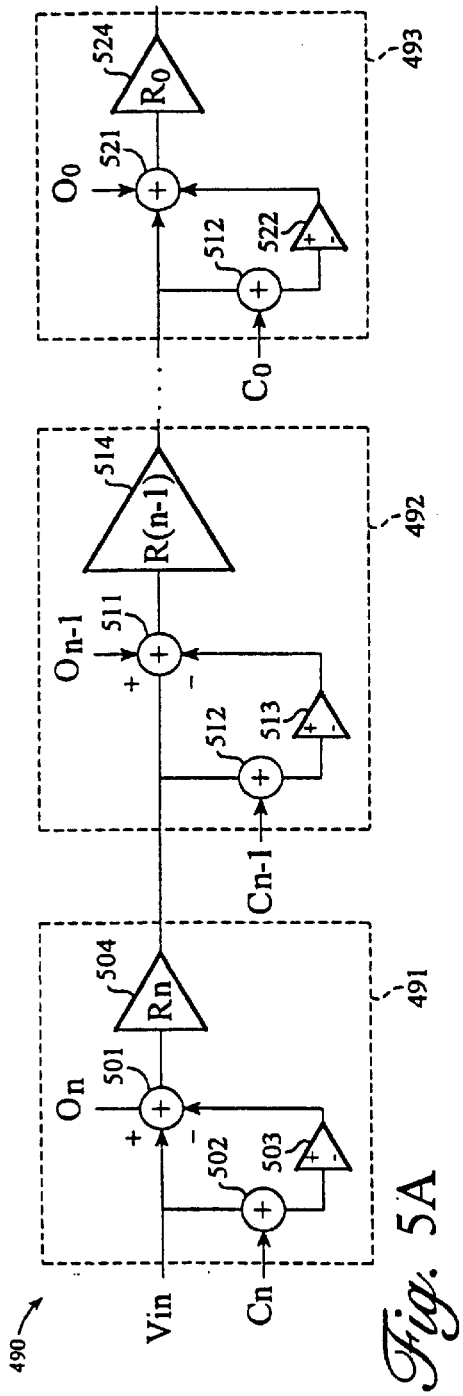
FIG. 5A is a circuit diagram of a PADCS including pipelined ADC stages according to the present invention.

Referring now to FIG. 5A, there is shown a conceptual circuit diagram of a PADCS 490 including pipelined ADC stages according to the present invention. In particular, PADCS 490 includes nth, (n−1)th, and zeroth ADC stages respectively 491, 492 and 493. Nth ADC stage 491 includes first and second summation nodes respectively 501 and 502, and a comparator 503 and an amplifier 504. (N−1)th ADC stage 492 includes first and second summation nodes respectively 511 and 512, a comparator 513, and an amplifier 514. Zeroth ADC stage 493 includes first and second summation nodes respectively 521 and 522, a comparator 523, and an amplifier 524. The nth ADC stage 491 receives an input voltage Vin and provides an output voltage at amplifier 504 to a first summing node 511 at its input. The (n−1)th ADC stage 492 receives an input voltage from the output of amplifier 504. The zeroth ADC stage 493 receives an input voltage from the output of an immediately preceding amplifier (not shown). According to the present invention, the first summation node (e.g., 501, 511, or 521 as applicable) in each ADC stage (e.g., 491, 492 or 493 as applicable) is provided with a respective offset, e.g., $O_n$, $O_{(n-1)}$ ... and $O_0$, as applicable. In each stage 491–493, a comparator offset (i.e., $C_N$, $C_{(N-1)}$ or $C_0$) is provided at the input of respective comparator 503, 513 and 523, as applicable.

Figure 5B:
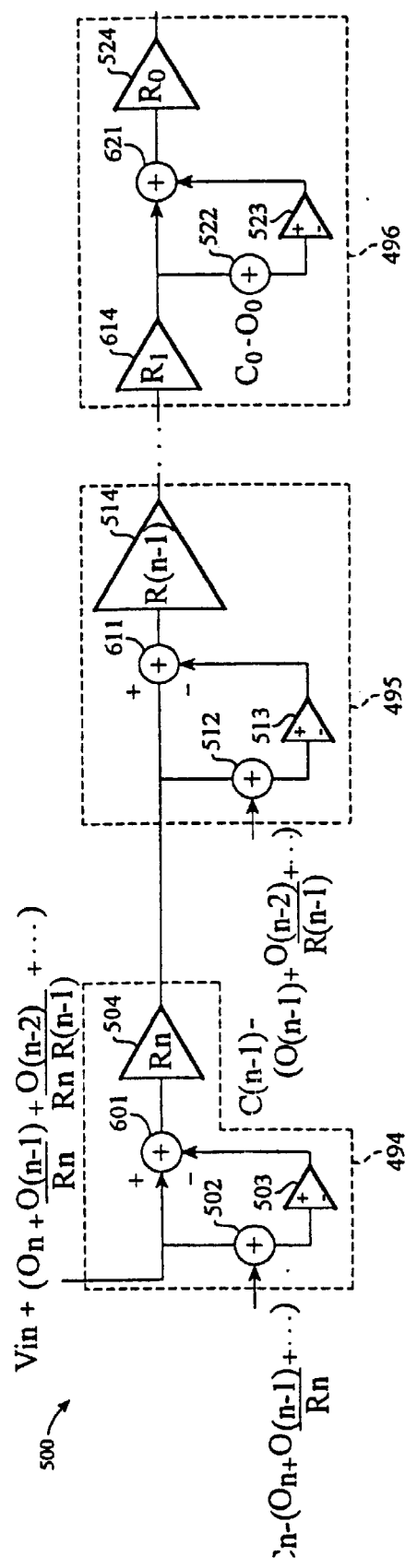
FIG. 5B is a circuit diagram of PADCS stages according to the present invention with offsets lumped at the ADC inputs.

Referring now to FIG. 5B, there is shown a conceptual circuit diagram of a PADCS 490 of pipelined ADC stages according to the present invention with offsets lumped at the ADC inputs. In particular, PADCS 500 includes n-th, (n−1)th, and zeroth ADC stages respectively 494, 495 and 496. Nth ADC stage 494 includes first and second summation nodes respectively 601 and 502, and a comparator 503 and an amplifier 504. (N−1)th ADC stage 495 includes first and second summation nodes respectively 611 and 502, and a comparator 513 and an amplifier 514. Zeroth ADC stage 496 includes first and second summation nodes respectively 621 and 522, and a comparator 523 and an amplifier 524. The nth ADC stage 494 receives an input and offset voltage $V_{IN}$+ $(O_N+O_{(N-1)}/R_N+O_{(N-2)}/(R_N*R_{(N-1)})+ \ldots )$ at the inputs of first and second summation nodes 611 and 502. Further, a comparator offset is provided to second summation node 502 in an amount of $C_N-(O_n+O_{(N-1)}/R_N+ \ldots )$. The (n−1)th ADC stage 495 receives an input voltage from the output of amplifier 504 and second summation node 512 receives a composite input including an offset of $C_{(N-1)}-[O_{(N-1)}+O_{(N-2)}/R_{(N-1)}+ \ldots ]$. The zeroth ADC stage 493 receives an input voltage from the output of amplifier 614 and second summation node 522 receives a composite input including an offset of $C_0-O_0$. As shown in FIG. 5B, the system offsets are lumped at the ADC input for analysis purposes. The offset of a given stage is subtracted from the comparator offset according to the present invention. As long as the total offset into a comparator is within the margin of error, the system will work as designed. By canceling most of the system offset, the extra allowance for offsets afforded by the redundancy can be used by the comparators. The system offset correction is accomplished using the offset cancellation procedure described below.

Figure 6:
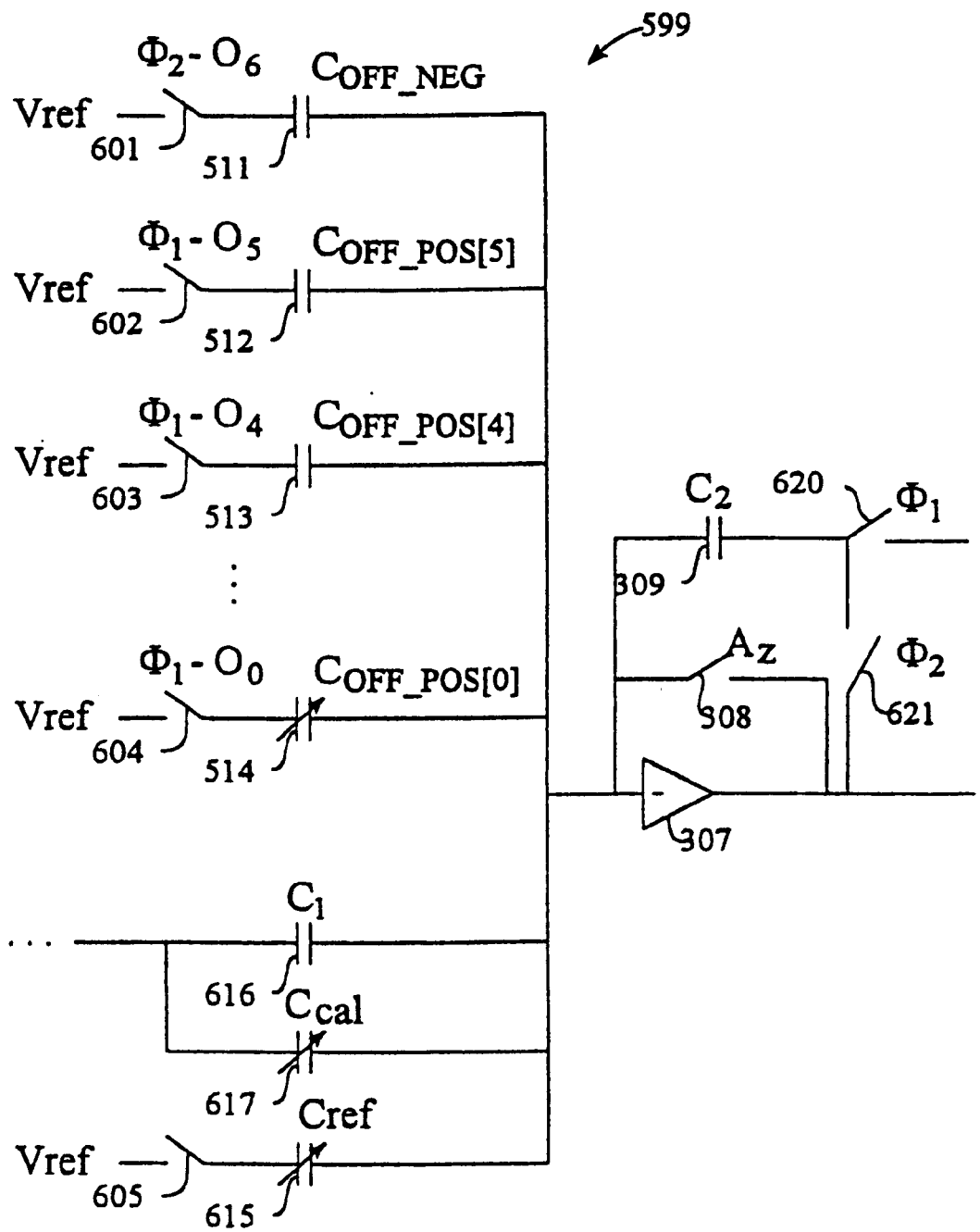
FIG. 6 is a diagram of offset capacitor connections in a single stage of a PADCS according to the present invention.

Referring now to FIG. 6, there is shown a diagram of the offset capacitors of a single stage 599 of a pipelined ADC system, according to the present invention. In particular, ADC stage 599 includes switches 601–605 which are opened and closed according to the product of phase and offset bit (i.e., $O_0*\phi_1$). ADC stage 599 further includes capacitors 511–514, amplifier 307, bypass switch 308, feedback capacitor 309 (C2) and first and second switches 620–621. Capacitors 601–617 are connected to the input of amplifier 307. Switches 601–604 are connected to corresponding capacitors 511–514. Capacitors 616 and 617 are connected in parallel, and the capacitance of each of capacitors 617 and 615 is variably settable according to the present invention. At the most-significant bit (MSB) stage, the calibration comparator reference is set to Vgnd. The input to the ADC is set to Vgnd. One conversion cycle occurs. The output of the MSB stage is compared to the calibration comparator reference. If the output is greater than the reference, there is a positive offset, and a negative offset must be added for compensation with charge added during the second phase of the clock. This is accomplished by setting the negative capacitor switch so that the capacitor is in the circuit. Next, the largest positive capacitor switch is set so the capacitor is in the circuit, adding charge during the first phase of the clock. One conversion cycle occurs. The output of the MSB stage is then compared to the calibration comparator reference. If the output is greater than the reference, too much positive offset was added, so the switch turns off. Otherwise, keep the switch on. Repeat the set and test procedure for the remaining positive capacitors. Once the system offset is canceled, the gain of each ADC stage is calibrated.

Referring now to FIG. 7, there is shown a circuit diagram of the final four stages of a pipelined ADC system 690 according to the present invention. In particular, ADC system 690 includes third, second, first and zeroth ADC stages respectively 691–694. Third ADC stage 691 includes first and second capacitors 701 and 703, an amplifier 702, a switch 704, and a track and hold circuit (THC) 705. The input of third ADC stage 691 is connected to ground (i.e., Vgnd) at the input of capacitor 701. Capacitor 701, amplifier 702, and THC 705 are connected in series. Amplifier 702, capacitor 703, and switch 704 are connected to each other in parallel. ADC system 690 further includes first, second, and third switches 750–752 respectively connecting said third and second, said second and first, and said first and zeroth ADC stages. Second ADC stage 692 includes first and second capacitors 711 and 713, an amplifier 712, a switch 714 and a THC 715. Capacitor 711, amplifier 712 and THC 715 are connected in series. Amplifier 712, capacitor 713, and switch 714 are connected to each other in parallel. First ADC stage 693 includes first and second capacitors 721 and 723, an amplifier 722, a switch 724, and a THC 725. Capacitor 721, amplifier 722, and THC 725 are connected in series. Amplifier 722, capacitor 723, and switch 724 are connected to each other in parallel. Zeroth ADC stage 694 includes first and second capacitors 731 and 733, an amplifier 732, a switch 734, and a THC 735. Capacitor 731, amplifier 732, and THC 735 are connected in series. Amplifier 732, capacitor 733, and switch 734 are connected to each other in parallel. Switch 750 is connected between THC 705 and capacitor 711; switch 751 is connected between THC 715 and capacitor 721; and switch 752 is connected between THC 725 and capacitor 731.

Referring now to FIG. 8, there is shown a circuit diagram illustrating the final four steps of a pipelined ADC system 690 according to the present invention. In particular, ADC system 690 includes third, second, first and zeroth ADC stages respectively 691–694. Third ADC stage 691 includes first and second capacitors 701 and 703, an amplifier 702, a switch 704, and a THC 705. A switch 800 is connected to the input of ADC system 690 and to the input of capacitor 701. Switch 800 is operative to switch between Vref and Vgnd during respective clock phases. ADC system 690 further includes first, second, and third switches 750, 751, and 752, respectively, connecting said third, second, first and zeroth ADC stages. Second ADC stage 692 includes first and second capacitors 711 and 713, an amplifier 712, a switch 714, and a THC 715. Capacitor 711, amplifier 712, and THC 715 are connected in series. Amplifier 712, capacitor 713, and switch 714 are connected to each other in parallel. First ADC stage 693 includes first and second capacitors 721 and 723, an amplifier 722, a switch 724, and a THC 725. Capacitor 721, amplifier 722, and THC 723 are connected in series. Amplifier 722, capacitor 723 and switch 724 are connected to each other in parallel. Zeroth ADC stage 694 includes first and second capacitors 731 and 733, an amplifier 732, a switch 734, and a THC 735. Capacitor 731, amplifier 732, and THC 735 are connected in series. Amplifier 732, capacitor 733 and switch 734 are connected to each other in parallel. Switch 750 is connected between THC 705 and capacitor 711. Switch 751 is connected between THC 715 and capacitor 721. Switch 752 is connected between THC 725 and capacitor 731.

The calibration technique described above uses a capacitor array to change the value of a given stage's R such that the weighting equation according to the present invention is satisfied. In order to achieve a desired 10-bit accuracy level, the capacitor ratio of the smallest to the largest capacitor would need to be 1:2048. This leads to very large capacitors on semiconductor products, which is undesirable in view of progress toward miniaturization. By changing the sampling capacitor (the capacitor in the first clock phase) and reference capacitor (the capacitor in the second clock phase) differently, a smaller ratio between the smallest and largest capacitors can be achieved according to the present invention. The equation for the gain R is then $$R_n = \frac{V_{ref(n)}}{V_{ref(n-1)}} \cdot \frac{C_{SAM(n-1)}}{C_{REF(n-1)}} \cdot \frac{C_{REF(n)}}{C_{FDBK(n)}}.$$

Adjustments are made for the sampling and reference capacitors because these implements need to be the same for most of the range, or the correction required can grow out of bounds. To accomplish this, the three least significant bits of the calibration capacitors are connected only to the reference and never the input. Thus, a reference voltage can be scaled down instead of the capacitors to achieve the smaller increments of charge desired for increased precision.

Referring again to FIG. 7, there is shown a procedure used according to the present invention to calibrate the gain of each stage of the ADC system. Note that the bottom three stages of the ADC system have fixed gains on the order of 7/4, 2, and 2 for stages two, one, and zero, respectively (third least-significant, the second least-significant, and the least-significant bits). The first stage to be calibrated according to the present invention is stage three. First, for four cycles, including the first clock phase, the third stage samples Vgnd while stages two, one and zero sample their respective voltage inputs. During the second clock phase, stage three's sampling capacitors stay at Vgnd while the sampling capacitors in stages two through zero switch to Vgnd, thereby dumping charge onto the feedback capacitor, C2. The output of stage zero after these four clock cycles will be the offset of these four stages combined $O_{TOT}$. This value is stored in the calibration comparator's reference memory. Second, the first calibration capacitor is switched in parallel with C1 in stage three. Thirdly, in the next four cycles, stage three samples Vref during phase one and Vgnd during phase two. Stages two through zero sample their respective inputs during phase one and Vref during phase two. This operation is illustrated in FIG. 8. The output of stage zero is then $R_3*R_2*R_1*R_0*V_{ref}(3)-R_2*R_1*R_0*V_{ref}(2)-R_1*R_0*V_{ref}(1)-R_0*V_{ref}(0)+O_{TOT}$. From this, it can be seen that if $R_3*R_2*R_1*R_0*V_{ref}(3)=R_2*R_1*R_0*V_{ref}(2)+R_1*R_0*V_{ref}(1)-R_0*V_{ref}(0)$, then the output of stage zero will be $O_{TOT}$.

Fourthly, this is compared to the calibration comparator's reference, which is $O_{TOT}$. If the output of stage zero is less than $O_{TOT}$, then R3 is too small and the capacitor stays in parallel with C1. If the output is greater than $O_{TOT}$, then R3 is too large and the capacitor is switched out of the data path. Fifthly, the second, third and fourth operations are repeated for the remaining capacitors in the calibration capacitor array and the reference capacitor array according to the present invention. Sixth, operation moves to a next preceding stage (i.e., four after three is complete) and the operations one through five are repeated.

What is claimed is:

1. A method of calibrating an analog-to-digital converter (ADC) having at least four stages, each having an input and an output connection and respectively producing at least first through fourth significant digits and having respective gains of R0–RN where N is an integer of 4 or greater and represents the most significant stage which produces the most significant digit and where the zeroth stage produces the least most significant digit, said method comprising:

applying an analog voltage to the input connection of the most significant stage;

setting R0, R1, and R2 to selected predetermined fixed gain values; and setting the gain of the fourth stage of an ADC according to the relationship R3R2R1R0=R2R1R0+R1R0+R0.

2. The method according to claim 1 including cancelling an offset voltage in at least a single one of the stages of said ADC.

3. Determining the offset voltage of a stage of a multistage analog-to-digital converter (ADC) having at least third through zeroth ADC stages, each ADC stage having a sampling and a calibration capacitor comprising:

providing a zero potential input to the third stage of a multistage ADC for a first phase of each of four cycles;

providing the output potential of the third stage to the input of the second stage, the output of the second stage to the input of the first stage, and the output of the first stage to the input of the zeroth stage;

grounding the sampling capacitors in each ADC stage for a second phase of the four cycles;

detecting an output voltage from the zeroth stage representing the zeroth state offset; and connecting a voltage source to said zeroth stage to cancel the amount of the zero stage output voltage.

4. A calibration method for an analog to digital converter (ADC) having at least zeroth through third stages, including a most significant stage (MSS) for producing a most significant bit (MSB), a least significant stage (LSS) for producing a least significant bit (LSB), a second least significant stage (SLSS) for producing a second least significant bit (SLSB), and a third least significant stage (TLSS) for producing a third least significant bit (TLSB); said LSS, said SLSS, and said TLSS, each having fixed gains not greater than two in magnitude; and each of the stages of said ADC including:

a stage input connection;

a stage output connection;

a capacitor circuit including first and second predetermined capacitors ($C_1$ and $C_2$), an offset capacitor circuit including positive and negative capacitances; and a variable capacitance calibration capacitor ($C_{cal}$), said first and second capacitors and said variable capacitance calibration capacitor being connected to each other at a capacitor common node;

an amplifier having an amplifier input connection and an amplifier output connection, said amplifier input connection being connected to said capacitor common node;

a comparator having a first comparator input connection (CIC) which is connected to said stage input connection, and a second CIC which is connected to a comparator reference voltage, and having a digital output connection providing a digital output which is a function of the input values on said first and second CICs;

a track and hold circuit (THC) coupled to said amplifier output connection, said THC having a THC input connection and a THC output connection, said THC input connection being coupled to the amplifier output connection; and a source follower circuit (SF) having a SF input connection and a SF output connection, said SF input connection being connected to the applicable stage output connection, and said SF output connection being connected to a calibration comparator; said calibration method comprising:

producing offset values for the respective third through zeroth ADC stages;

establishing a calibration comparator reference value;

adding a first third stage candidate calibration capacitor in parallel to the first predetermined capacitor in the third ADC stage to establish a candidate third stage gain value;

alternately sampling in four cycles, Vref and Vgnd with the third ADC stage and Vref and the output of the preceding ADC stage with the second through zeroth ADC stages to produce a zeroth stage output $O_{TOT}$;

comparing the calibration comparator's reference voltage with the zeroth stage output $O_{TOT}$ and retaining the first third stage candidate calibration capacitor if the current $O_{TOT}$ is less than the prior $O_{TOT}$; and a calibration method including producing offset values for the respective third through zeroth ADC stages by sampling ground potential with stage three while sampling the outputs of the preceding ADC stages with each succeeding ADC stage for a first phase of each of four cycles, and grounding the sampling capacitors in each of the ADC stages for a second phase of each of the four cycles, to produce a zeroth stage offset value for use as a calibration comparator offset reference value.

5. A multi-stage analog-to-digital converter wherein each stage comprises:

a stage input connection;

a stage output connection;

a capacitor circuit including first and second predetermined capacitors ($C_1$ and $C_2$), an offset capacitor circuit including positive and negative capacitances, and a variable capacitance calibration capacitor ($C_{cal}$), said first and second capacitors and said variable capacitance calibration capacitor being connected to each other at a capacitor common node;

an amplifier having an amplifier input connection and an amplifier output connection, said amplifier input connection being connected to said capacitor common node;

a comparator having a first comparator input connection (CIC) which is connected to said stage input connection, and a second CIC which is connected to a comparator reference voltage, and having a digital output connection providing a digital output which is a function of the input values on said first and second CICs;

a track and hold circuit (THC) coupled to said amplifier output connection, said THC having a THC input connection and a THC output connection, said THC input connection being coupled to the amplifier output connection; and a source follower circuit (SF) having a SF input connection and a SF output connection, said SF input connection being connected to the applicable stage output connection, and said SF output connection being connected to a calibration comparator.

6. A calibration sequence for a multistage analog-to-digital converter (ADC) having zeroth through third stages, including:

in a first phase of a first cycle, sampling a reference voltage with the third ADC stage, and the preceding stage output voltage with said second through zeroth ADC stages;

in a second phase of a first cycle, sampling ground with the third ADC stage and a reference voltage with said second through zeroth ADC stages;

in a first phase of a second cycle, sampling a reference voltage with the third ADC stage, and the preceding stage output voltage with said second through zeroth ADC stages;

in a second phase of a second cycle, sampling ground with the third ADC stage and a reference voltage with said second through zeroth ADC stages;

in a first phase of a third cycle, sampling a reference voltage with the third ADC stage, and the preceding stage output voltage with said second through zeroth ADC stages;

in a second phase of a third cycle, sampling ground with the third ADC stage and a reference voltage with said second through zeroth ADC stages;

in a first phase of a fourth cycle, sampling a reference voltage with the third ADC stage, and the preceding stage output voltage with said second through zeroth ADC stages; and in a second phase of a fourth cycle, sampling ground with the third ADC stage and a reference voltage with said second through zeroth ADC stages.

7. A calibration method for an analog to digital converter (ADC) having at least zeroth through third stages; each stage having a stage input connection; a stage output connection; a capacitor circuit including first and second predetermined capacitors ($C_1$ and $C_2$) and a variable capacitance calibration capacitor ($C_{cal}$), said first and second capacitors and said variable capacitance calibration capacitor being connected to each other at a capacitor common node; an amplifier having an amplifier input connection and an amplifier output connection, said amplifier input connection being connected to said capacitor common node; a comparator having a first comparator input connection (CIC) which is connected to said stage input connection, and a second CIC and having a digital output connection providing a digital output which is a function of the input values on said first and second CICs; a track and hold circuit (THC) coupled to said amplifier output connection, said THC having a THC input connection and a THC output connection; and a source follower circuit (SF) having a SF input connection and a SF output connection, said SF input connection being connected to the applicable stage output connection, and said SF output connection being connected to said second CIC; said calibration method comprising:

connecting the first predetermined capacitor and said comparator to said input connection, for each of said zeroth through third stages;

connecting said second predetermined capacitor to ground, for each of said zeroth through third stages;

disconnecting the first predetermined capacitor from said input connection, for each of said zeroth through third stages;

connecting said second predetermined capacitor to the output connection of said amplifier, for each of said zeroth through third stages;

tracking the output of said amplifier; and providing the output of said SF circuit to said comparator to enable a determination whether the input voltage of an applicable stage is greater than or less than the output of said SF circuit.

8. The calibration method according to claim 7 further comprising detecting the output of the THC of one stage and providing said THC output to a next one of the stages of said ADC.

9. The calibration method according to claim 7 further comprising sampling ground potential with a most significant stage (MSS) of the ADC.

10. The calibration method according to claim 9 wherein said MSS is the third stage of the ADC.

11. The calibration method according to claim 7 including connecting the second, first and zeroth stages capacitor to ground.

12. A calibration method for an analog-to-digital converter (ADC) having a plurality stages including a most significant stage (MSS) and a least significant stage (LSS), each stage comprising:

a stage input connection;

a stage output connection;

a capacitor circuit including first and second predetermined capacitors ($C_1$ and $C_2$), an offset capacitor circuit including positive and negative capacitances; and a variable capacitance calibration capacitor ($C_{cal}$), said first and second capacitors and said variable capacitance calibration capacitor being connected to each other at a capacitor common node;

an amplifier having an amplifier input connection and an amplifier output connection, said amplifier input connection being connected to said capacitor common node;

a comparator having a first comparator input connection (CIC) which is connected to said stage input connection, and a second CIC which is connected to a comparator reference voltage, and having a digital output connection providing a digital output which is a function of the input values on said first and second CICs;

a track and hold circuit (THC) coupled to said amplifier output connection, said THC having a THC input connection and a THC output connection; and a source follower circuit (SF) having a SF input connection and a SF output connection, said SF input connection being connected to the applicable stage output connection, and said SF output connection being connected to said second CIC; said calibration method comprising:

setting the calibration comparator reference voltage of the MSS to ground potential;

setting the input voltage of the ADC MSS to ground potential;

perform a first conversion cycle to produce an output voltage for the MSS;

comparing the output of the MSS with the comparator reference voltage;

producing an offset setting which is a function of the difference between the MSS output and the comparator reference voltage; and performing another conversion cycle to produce another MSS output voltage to establish a refined offset setting.

13. A calibration method for an analog to digital converter (ADC) having at least zeroth through fourth stages, including a most significant stage (MSS) for producing a most significant bit (MSB), a least significant stage (LSS) for producing a least significant bit (LSB), a second least significant stage (SLSS) for producing a second least significant bit (SLSB), and a third least significant stage (TLSS) for producing a third least significant bit (TLSB); said LSS, said SLSS, and said TLSS, each having fixed gains not greater than two in magnitude; and each of the stages of said ADC including:

a stage input connection;

a stage output connection;

a capacitor circuit including first and second predetermined capacitors ($C_1$ and $C_2$), an offset capacitor circuit including positive and negative capacitances; and a variable capacitance calibration capacitor ($C_{cal}$), said first and second capacitors and said variable capacitance calibration capacitor being connected to each other at a capacitor common node;

an amplifier having an amplifier input connection and an amplifier output connection, said amplifier input connection being connected to said capacitor common node;

a comparator having a first comparator input connection (CIC) which is connected to said stage input connection, and a second CIC which is connected to a comparator reference voltage, and having a digital output connection providing a digital output which is a function of the input values on said first and second CICs;

a track and hold circuit (THC) coupled to said amplifier output connection, said THC having a THC input connection and a THC output connection; and a source follower circuit (SF) having a SF input connection and a SF output connection, said SF input connection being connected to the applicable stage output connection, and said SF output connection being connected to said second CIC; said calibration method comprising:

producing offset values for the respective third through zeroth ADC stages;

establishing a calibration comparator reference value;

adding a first third stage candidate calibration capacitor in parallel to the first predetermined capacitor in the third ADC stage to establish a candidate third stage gain value;

alternately sampling in four cycles, Vref and Vgnd with the third ADC stage and Vref and the output of the preceding ADC stage with the second through zeroth ADC stages to produce a zeroth stage output $O_{TOT}$; and comparing the calibration comparator's reference voltage with the zeroth stage output $O_{TOT}$ and retaining the first third stage candidate calibration capacitor if the current $O_{TOT}$ is less than the prior $O_{TOT}$.

14. A calibration method according to claim 13 including:

producing offset values for the respective third through zeroth ADC stages by sampling ground potential with stage three while sampling the outputs of the preceding ADC stages with each succeeding ADC stage for a first phase of each of four cycles, and grounding the sampling capacitors in each of the ADC stages for a second phase of each of the four cycles, to produce a zeroth stage offset value for use as a calibration comparator offset reference value.

* * * * *